(12) United States Patent
Chou et al.

(10) Patent No.: US 10,470,308 B1
(45) Date of Patent: Nov. 5, 2019

(54) PRINTED CIRCUIT BOARD ASSEMBLY AND ELECTRONIC DEVICE USING THE SAME

(71) Applicants: HONG FU JIN PRECISION INDUSTRY (WuHan) CO., LTD., Wuhan (CN); HON HAI PRECISION INDUSTRY CO., LTD., New Taipei (TW)

(72) Inventors: Hou-Yuan Chou, New Taipei (TW); Ming-Fang Chen, Wuhan (CN); Yi-Chih Wu, New Taipei (TW)

(73) Assignees: HONGFUJIN PRECISION INDUSTRY (WUHAN) CO., LTD., Wuhan (CN); HON HAI PRECISION INDUSTRY CO., LTD., New Taipei (TW)

( * ) Notice: Subject to any disclaimer, the term of this patent is extended or adjusted under 35 U.S.C. 154(b) by 0 days.

(21) Appl. No.: 16/186,295

(22) Filed: Nov. 9, 2018

(30) Foreign Application Priority Data

Jun. 14, 2018 (CN) .......................... 2018 1 0615157

(51) Int. Cl.
| | |
|---|---|
| H05K 7/00 | (2006.01) |
| H05K 1/14 | (2006.01) |
| H05K 1/18 | (2006.01) |
| H05K 1/11 | (2006.01) |

(52) U.S. Cl.
CPC ............ *H05K 1/144* (2013.01); *H05K 1/115* (2013.01); *H05K 1/18* (2013.01); *H05K 7/00* (2013.01); *H05K 2201/10159* (2013.01)

(58) Field of Classification Search
None
See application file for complete search history.

(56) References Cited

U.S. PATENT DOCUMENTS

| | | | |
|---|---|---|---|
| 8,115,113 B2 * | 2/2012 | Tanaka .................... | H05K 1/162 174/260 |
| 2007/0025091 A1 * | 2/2007 | Shimada ................ | H05K 3/387 361/750 |
| 2009/0079065 A1 * | 3/2009 | Furgut ................. | H01L 23/3121 257/724 |
| 2009/0151990 A1 * | 6/2009 | Nishino ............... | H05K 3/4655 174/258 |
| 2009/0241332 A1 * | 10/2009 | Lauffer .................. | H05K 3/462 29/829 |
| 2011/0094786 A1 * | 4/2011 | Liu ....................... | H05K 1/0251 174/262 |

* cited by examiner

*Primary Examiner* — Courtney L Smith
*Assistant Examiner* — Rashen E Morrison
(74) *Attorney, Agent, or Firm* — ScienBiziP, P.C.

(57) ABSTRACT

A circuit board assembly comprising a printed circuit main board and a printed circuit sub-board, to avoid layout constraints, can support components on either board. The printed circuit main board includes first signal layer, and first and second through holes in the first signal layer. A first wire electrically couples a first electronic component and the first through hole. A second signal layer with third and fourth through holes is found on the printed circuit sub-board. The third through hole is electrically coupled to the first through hole, and the fourth through hole is electrically coupled to the second through hole.

16 Claims, 3 Drawing Sheets

PRINTED CIRCUIT BOARD ASSEMBLY AND ELECTRONIC DEVICE USING THE SAME

FIELD

The subject matter herein generally relates to printed circuit board manufacture.

BACKGROUND

There are multiple signal lines between the electronic components on the motherboard, and a multi-layer arrangement is needed for the motherboard to accommodate these lines. This limits the possible layouts of the motherboard.

Therefore, there is room for improvement within the art.

BRIEF DESCRIPTION OF THE DRAWINGS

Implementations of the present disclosure will now be described, by way of example only, with reference to the attached figures.

DETAILED DESCRIPTION

Figure 1:
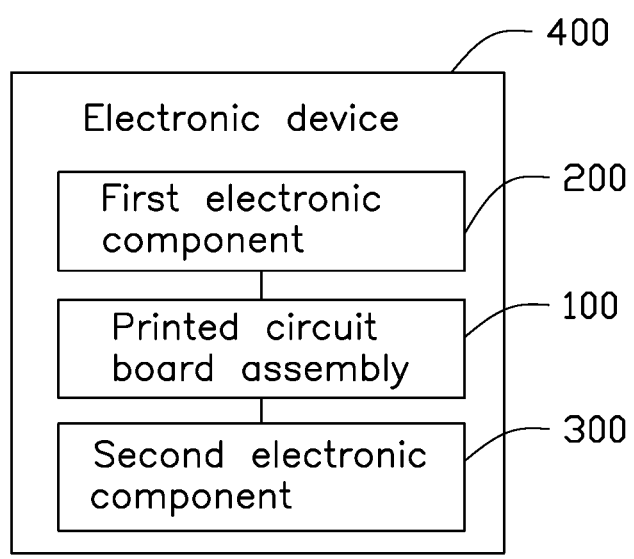
FIG. 1 is a block diagram of an electronic device in accordance with an exemplary embodiment of the present disclosure.

It will be appreciated that for simplicity and clarity of illustration, where appropriate, reference numerals have been repeated among the different figures to indicate corresponding or analogous elements. Additionally, numerous specific details are set forth in order to provide a thorough understanding of the embodiments described herein. However, it will be understood by those of ordinary skill in the art that the embodiments described herein can be practiced without these specific details. In other instances, methods, procedures and components have not been described in detail so as not to obscure the related relevant feature being described. The drawings are not necessarily to scale and the proportions of certain parts may be exaggerated to better illustrate details and features. The description is not to be considered as limiting the scope of the embodiments described herein.

Several definitions that apply throughout this disclosure will now be presented.

The term "coupled" is defined as connected, whether directly or indirectly through intervening components, and is not necessarily limited to physical connections. The connection can be such that the objects are permanently connected or releasably connected. The term "comprising" means "including, but not necessarily limited to"; it specifically indicates open-ended inclusion or membership in a so-described combination, group, series, and the like.

FIG. 1 illustrates an electronic device 400 in accordance with an exemplary embodiment. The electronic device 400 includes a printed circuit board (PCB) assembly 100, a first electronic component 200, and a second electronic component 300.

Both the first electronic component 200 and the second electronic component 300 are mounted on the printed circuit board assembly 100. The first electronic component 200 can communicate with the second electronic component 300 through the printed circuit board assembly 100.

Figure 2:
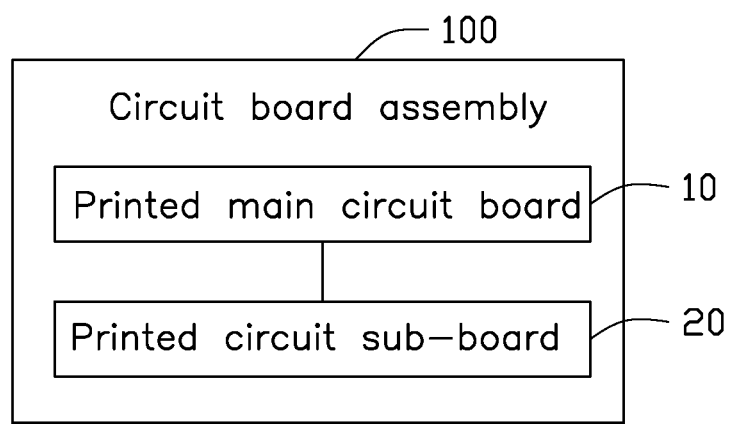
FIG. 2 is a block diagram of an exemplary embodiment of a printed circuit board assembly.

FIG. 2 illustrates that the printed circuit board assembly 100 includes a main printed circuit board 10 and a printed circuit sub-board 20. The main printed circuit board 10 is electrically coupled to the printed circuit sub-board 20. Both the first electronic component 200 and the second electronic component 300 are mounted in a signal layer of the main printed circuit board 10.

Figure 3:
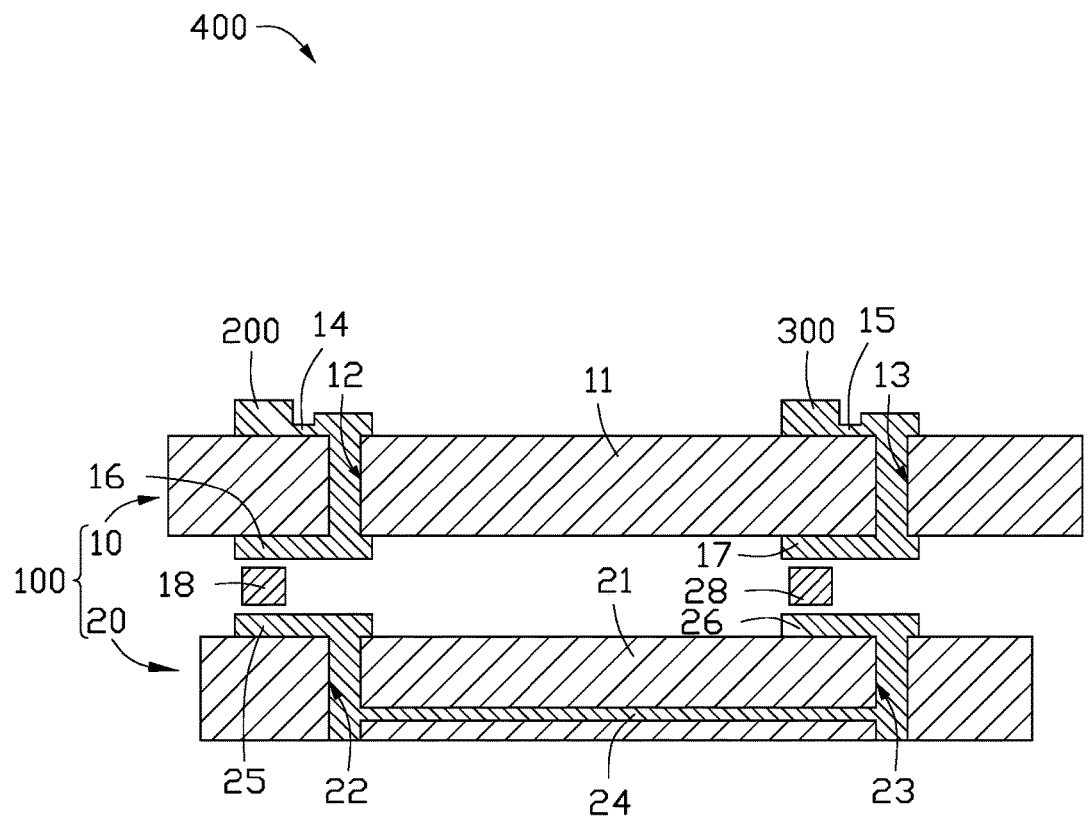
FIG. 3 is a schematic diagram of an exemplary embodiment of the electronic device.

FIG. 3 illustrates that the main printed circuit board 10 includes a first signal layer 11, a first through hole 12, and a second through hole 13.

The first through hole 12 is disposed in the first signal layer 11, and the second through hole 13 is disposed in the first signal layer 11 at a location different from where the first through hole 12 is disposed.

In other exemplary embodiment, the main printed circuit board 10 further includes a plurality of first signal layers 11.

The main printed circuit board 10 further includes a first wire 14 and a second wire 15. Both the first wire 14 and the second wire 15 are mounted in the signal layer of the main printed circuit board 10.

In at least one exemplary embodiment, the first wire 14 is electrically coupled between signal pins (not shown) of the first electronic component 200 and the first through hole 12. The second wire 15 is electrically coupled between signal pins (not shown) of the second electronic component 300 and the second through hole 13.

The printed circuit sub-board 20 further includes a second signal layer 21, a third through hole 22, and a fourth through hole 23.

The third through hole 22 is disposed in the second signal layer 21, and the fourth through hole 23 is disposed in the second signal layer 21 at a location different from where the third through hole 22 is disposed.

The third through hole 22 is electrically coupled to the first through hole 12, and the fourth through hole 23 is electrically coupled to the second through hole 13.

A seventh wire 24 is disposed inside the second signal layer 21, and the seventh wire 24 electrically connects the third through hole 22 and the fourth through hole 23.

The signal pins of the first electronic component 200 are electrically connected to the signal pins of the second electronic component 300, the connections sequentially passing through the first wire 14, the first through hole 12, the third through hole 22, the seventh wire 24, the fourth through hole 23, the second through hole 13, and the second wire 15.

Other electronic components may be disposed on the printed circuit sub-board 20 to save space on the main printed circuit board 10.

In at least one exemplary embodiment, both the first through hole 12 and the second through hole 13 are disposed in a direction perpendicular to the first signal layer 11.

Both the third through hole 22 and fourth through hole 23 are disposed in a direction perpendicular to the second signal layer 21. The seventh wire 24 may be disposed in a direction parallel to the second signal layer 21.

The first through hole 12, the second through hole 13, the third through hole 22, and the fourth through hole 23 each has an internal conductor.

In at least one exemplary embodiment, the first electronic component 200 can be a graphics processing unit (GPU), and the first electronic component 200 can be a memory.

In at least one exemplary embodiment, the main printed circuit board 10 can be a motherboard, and the electronic device 400 can be a computer or a server.

The main printed circuit board 10 further includes a third wire 16, and the printed circuit sub-board 20 further includes a fourth wire 25.

By a soldering process (solder 18), the third wire 16 is electrically coupled to the first through hole 12, the fourth wire 25 is electrically coupled to the third through hole 22, and the first through hole 12 is electrically coupled to the fourth wire 25.

For example, the first wire 14 is located at a top of the first signal layer 11, the third wire 16 is located at a bottom of the first signal layer 11, and the first wire 14 is electrically coupled to the fourth wire 25 through the first through hole 12.

The fourth wire 25 is located at a top of the second signal layer 21, and the third wire 16 is electrically coupled to the fourth wire 25 through the solder 18.

In at least one exemplary embodiment, the main printed circuit board 10 further includes a fifth wire 17, and the printed circuit sub-board 20 further includes a sixth wire 26.

The fifth wire 17 is electrically coupled to the second through hole 13, the sixth wire 26 is electrically coupled to the fourth through hole 23, and the fifth wire 17 is electrically coupled to the sixth wire 26 through a solder 28.

For example, the second wire 15 is located at the top of the first signal layer 11, and the fifth wire 17 is located at the bottom of the first signal layer 11. The sixth wire 26 is located at the top of the second signal layer 21.

The fourth wire 25 is electrically coupled to the sixth wire 26 through the third through hole 22 and the seventh wire 24, the fifth wire 17 is electrically coupled to the sixth wire 26 through the solder 28, and the second wire 15 is electrically coupled to the fifth wire 17 through the second through hole 13.

The first electronic component 200 is electrically coupled to the second electronic component 300 through the first through hole 12, the second through hole 13, the third through hole 22, and the fourth through hole 23.

The main printed circuit board 10 is electrically coupled to the printed circuit sub-board 20 through the wires and the through holes. Thus, the first electronic component 200 can communicate with the second electronic component 300 through the printed circuit board assembly 100.

The embodiments shown and described above are only examples. Even though numerous characteristics and advantages of the present technology have been set forth in the foregoing description, together with details of the structure and function of the present disclosure, the disclosure is illustrative only, and changes may be made in the detail, including in matters of shape, size and arrangement of the parts within the principles of the present disclosure, up to and including the full extent established by the broad general meaning of the terms used in the claims.

What is claimed is:

1. A printed circuit board (PCB) assembly for establishing communication between a first electronic component and a second electronic component, the printed circuit board assembly comprising:
   a main printed circuit board comprising:
      a first signal layer;
      a first through hole and a second through hole; wherein both the first through hole and the second through hole are disposed in the first signal layer;
      a first wire electrically coupled between the first electronic component and the first through hole; and
      a second wire electrically coupled between the second electronic component and the second through hole;
   a printed circuit sub-board comprising:
      a second signal layer and a third wire;
      a third through hole and a fourth through hole; wherein both the third through hole and the fourth through hole are disposed in the second signal layer, the third through hole is electrically coupled to the first through hole, the fourth through hole is electrically coupled to the second through hole, and the third through hole is electrically coupled to the fourth through hole through the third wire;
   wherein the first through hole, the second through hole, the third through hole, and the fourth through hole each has an internal conductor.

2. The printed circuit board assembly of claim 1, wherein the main printed circuit board further comprises a fourth wire, and the fourth wire is electrically coupled to the first through hole.

3. The printed circuit board assembly of claim 2, wherein the printed circuit sub-board further comprises a fifth wire, and the fifth wire is electrically coupled to the third through hole.

4. The printed circuit board assembly of claim 3, wherein the fourth wire is electrically coupled to the fifth wire through a first solder.

5. The printed circuit board assembly of claim 4, wherein the main printed circuit board further comprises a sixth wire, and the sixth wire is electrically coupled to the second through hole.

6. The printed circuit board assembly of claim 5, wherein the sub-printed circuit board further comprises a seventh wire, and the seventh wire is electrically coupled to the fourth through hole.

7. The printed circuit board assembly of claim 6, wherein the sixth wire is electrically coupled to the seventh wire through a second solder.

8. An electronic device comprising:
   a first electronic component;
   a second electronic component;
   a main printed circuit board comprising:
      a first signal layer;
      a first through hole and a second through hole; wherein both the first through hole and the second through hole are disposed in the first signal layer;
      a first wire electrically coupled between the first electronic component and the first through hole; and
      a second wire electrically coupled between the second electronic component and the second through hole;
   a printed circuit sub-board comprising:
      a second signal layer and a third wire e;
      a third through hole and a fourth through hole; wherein both the third through hole and the fourth through hole are disposed in the second signal layer, the third through hole is electrically coupled to the first through hole, the fourth through hole is electrically coupled to the second through hole, and the third through hole is electrically coupled to the fourth through hole through the third wire;
   wherein the first through hole, the second through hole, the third through hole, and the fourth through hole each has an internal conductor.

9. The electronic device of claim 8, wherein the main printed circuit board further comprises a fourth wire, and the fourth wire is electrically coupled to the first through hole.

10. The electronic device of claim 9, wherein the sub-printed circuit board further comprises a fifth wire, and the fifth wire is electrically coupled to the third through hole.

11. The electronic device of claim 10, wherein the fourth wire is electrically coupled to the fifth wire through a first solder.

12. The electronic device of claim 11, wherein the main printed circuit board further comprises a sixth wire, and the sixth wire is electrically coupled to the second through hole.

13. The electronic device of claim 12, wherein the printed circuit sub-board further comprises a seventh wire, and the seventh wire is electrically coupled to the fourth through hole.

14. The electronic device of claim 13, wherein the sixth wire is electrically coupled to the seventh wire through a second solder.

15. The electronic device of claim 8, wherein the first electronic component is a graphics processing unit (GPU), and the first electronic component is a memory.

16. The electronic device of claim 8, wherein the main printed circuit board is a motherboard.

* * * * *